(12) United States Patent
Mignot et al.

(10) Patent No.: US 11,901,440 B2
(45) Date of Patent: Feb. 13, 2024

(54) SACRIFICIAL FIN FOR SELF-ALIGNED CONTACT RAIL FORMATION

(71) Applicant: International Business Machines Corporation, Armonk, NY (US)

(72) Inventors: Yann Mignot, Slingerlands, NY (US); Christopher J. Waskiewicz, Rexford, NY (US); Su Chen Fan, Cohoes, NY (US); Brent Anderson, Jericho, VT (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 17/465,316

(22) Filed: Sep. 2, 2021

(65) Prior Publication Data
US 2023/0064608 A1     Mar. 2, 2023

(51) Int. Cl.
| *H01L 29/66* | (2006.01) |
| *H01L 23/48* | (2006.01) |
| *H01L 21/8234* | (2006.01) |
| *H01L 29/78* | (2006.01) |
| *H01L 29/08* | (2006.01) |

(52) U.S. Cl.
CPC ......... *H01L 29/66795* (2013.01); *H01L 21/823418* (2013.01); *H01L 21/823431* (2013.01); *H01L 23/481* (2013.01); *H01L 29/0847* (2013.01); *H01L 29/7851* (2013.01)

(58) Field of Classification Search
CPC ....... H01L 29/66795; H01L 21/823418; H01L 21/823431; H01L 23/481; H01L 29/0847; H01L 29/7851; H01L 21/823475
See application file for complete search history.

(56) References Cited

U.S. PATENT DOCUMENTS

| 6,686,231 | B1 | 2/2004 | Ahmed et al. |
| 8,617,957 | B1 | 12/2013 | Chang et al. |
| 9,048,262 | B2 | 6/2015 | Adam et al. |
| 9,312,384 | B2 | 4/2016 | Lo et al. |
| 10,192,792 | B2 | 1/2019 | Kim |
| 10,242,881 | B2 | 3/2019 | Cheng et al. |
| 10,461,186 | B1 | 10/2019 | Zhang et al. |
| 2016/0336225 | A1 | 11/2016 | Chen et al. |
| 2017/0005169 | A1 | 1/2017 | Loubet et al. |
| 2018/0337256 | A1* | 11/2018 | Anderson ......... H01L 29/41741 |

(Continued)

OTHER PUBLICATIONS

Anonymous, "Self-Aligned Gate and MOL Patterning for VTFET", IP.com Electronic Publication Date: Mar. 27, 2020, 11 pages, IP.com No. IPCOM000261692D.

(Continued)

*Primary Examiner* — Fernando L Toledo
*Assistant Examiner* — Adam S Bowen
(74) *Attorney, Agent, or Firm* — Scully, Scott, Murphy & Presser, P.C.; L. Jeffrey Kelly, Esq.

(57) ABSTRACT

A semiconductor device containing a self-aligned contact rail is provided. The self-aligned contact rail can have a reduced critical dimension, CD. The self-aligned contact rail can be obtained utilizing a sacrificial semiconductor fin as a placeholder structure for the contact rail. The used of the sacrificial semiconductor fin enables reduced, and more controllable, CDs.

20 Claims, 11 Drawing Sheets

(56) References Cited

U.S. PATENT DOCUMENTS

2018/0342507 A1* 11/2018 Xie .................. H01L 29/7827
2019/0214307 A1 7/2019 Xie et al.

OTHER PUBLICATIONS

Anonymous, "Method and Structure for Composite Middle of the Line (MOL) Interlayer Dielectric(ILD) for Low Interconnect Resistance", IP.com Electronic Publication Date: Dec. 7, 2018, 6 pages, IP.com No. IPCOM000256543D.

* cited by examiner

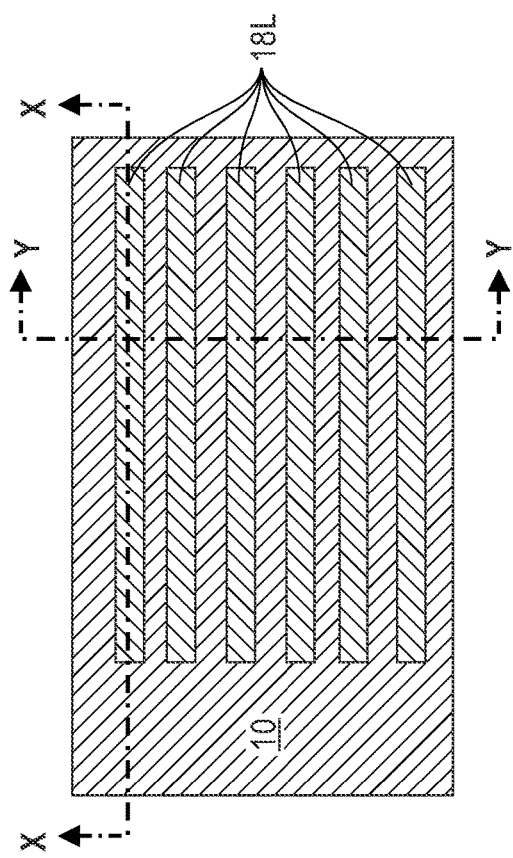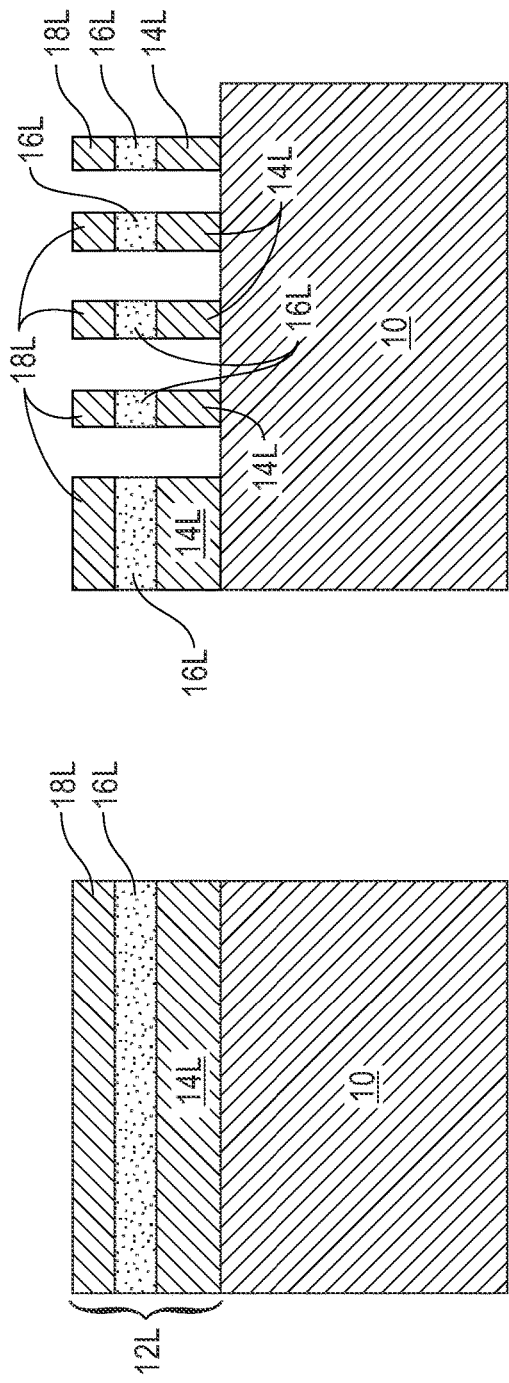
FIG. 1A
FIG. 1B
FIG. 1C

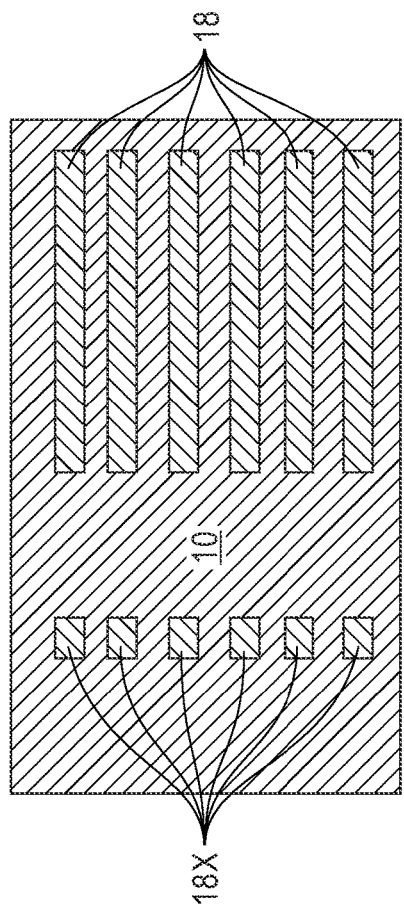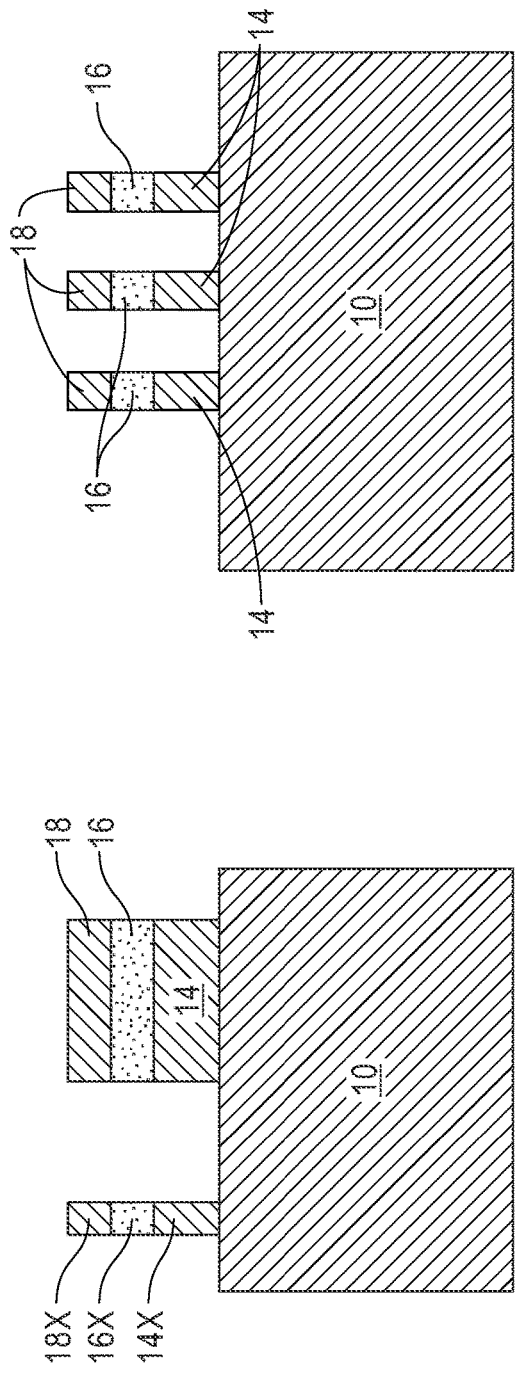

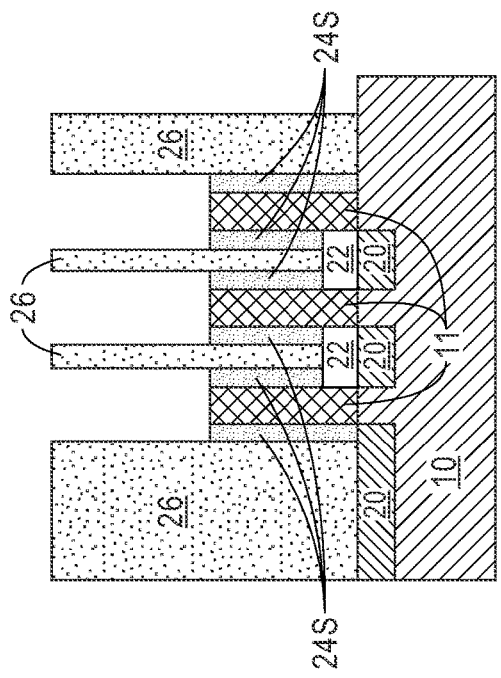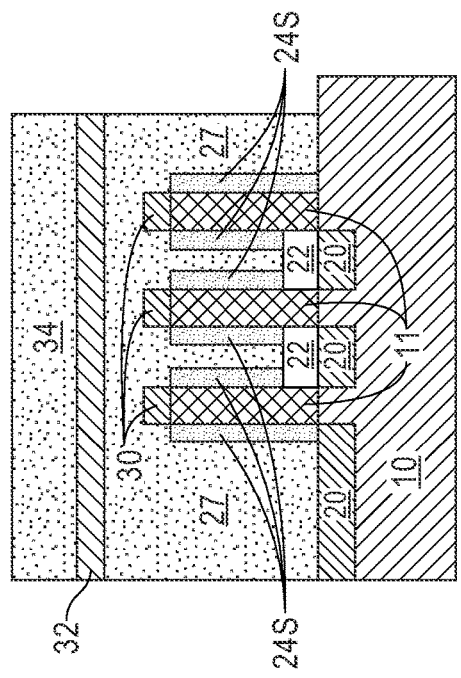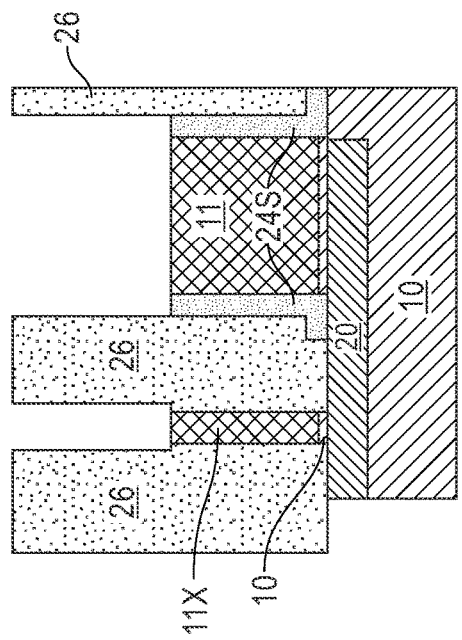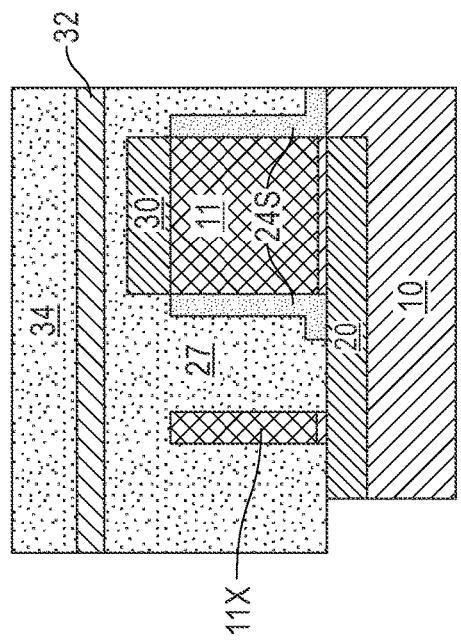

SACRIFICIAL FIN FOR SELF-ALIGNED CONTACT RAIL FORMATION

BACKGROUND

The present application relates to semiconductor technology, and more particularly to a semiconductor device containing a self-aligned contact rail.

Conventional semiconductor devices such as, for example, vertical transport field effect transistors (VTFETs) typically include a contact rail that is connected to a source/drain region of the device in an area outside of the active device region. In such semiconductor devices, the contact rail is not self-aligned, and the non-self-aligned contact rail has a large critical dimension (on the order of 25 nm or greater) which can lead to parasitic shorts within the device. There is thus a need to provide a semiconductor device such as, for example, a VTFET, in which a self-aligned contact rail is formed that has a reduced critical dimension.

SUMMARY

A semiconductor device containing a self-aligned contact rail is provided. The term "self-aligned" as used herein in connection with the contact rail denotes that the bottommost surface of the contact rail is formed directly on an underlying source/drain region without any overlay error. In the prior art, the contact rails have some misalignment (at least 1 nm to 2 nm) between the contact rail and the underlying source/drain region. In some embodiments, the self-aligned contact rail of the present application can have a reduced critical dimension, CD. By reduced "CD" it is that at least a lower portion of the contact rail has a CD dimension that is less than the CD that can be obtained utilizing current lithographic processes. For example, current lithographic processes provide a structure having a CD of greater than 25 nm, while the present application can provide a contact rail having a lower portion having a CD of 25 nm or less. The self-aligned contact rail can be obtained utilizing a sacrificial semiconductor fin as a placeholder structure for the contact rail. The use of sacrificial semiconductor fin enables reduced, and more controllable, CDs.

In one aspect of the present application, a semiconductor device is provided. In one embodiment of the present application, the semiconductor device includes a functional gate structure including a first source/drain region located a first end of a semiconductor channel material structure and a second source/drain region located at a second end of the semiconductor channel material structure. The device further includes a contact rail located laterally adjacent to the functional gate structure and contacting a surface of the first source/drain region of the functional gate structure, wherein the contact rail has a lower portion having a first critical dimension and an upper portion having a second critical dimension that is greater than the first critical dimension.

In another embodiment of the present application, the semiconductor device includes a functional gate structure including a first source/drain region located a first end of a semiconductor channel material structure and a second source/drain region located at a second end of the semiconductor channel material structure. The device further includes a contact rail located laterally adjacent to the functional gate structure and contacting a surface of the first source/drain region of the functional gate structure, wherein the contact rail has a constant critical dimension in a direction along the semiconductor channel material structure.

In another aspect of the present application, a method of forming a semiconductor device is provided. In one embodiment, the method includes forming at least one sacrificial semiconductor fin in a first region of a semiconductor substrate and at least one active semiconductor fin in a second region of the semiconductor substrate, wherein the at least one sacrificial semiconductor fin has a first critical dimension. A source/drain region is then formed on the semiconductor substrate in the first region including the at least one sacrificial semiconductor fin and the second region including the at least one active semiconductor fin. Next, a functional gate structure is formed in the second region and laterally adjacent to the at least one active semiconductor fin, and thereafter a dielectric material stack is formed laterally adjacent to, and above, the at least one sacrificial semiconductor fin and the at least one active semiconductor fin. An opening is then formed in the dielectric material stack that physically exposes the at least one sacrificial semiconductor fin, wherein the opening has a second critical dimension that is greater than the first critical dimension of the at least one sacrificial semiconductor fin. The at least one sacrificial semiconductor fin is then removed to provide a contact rail opening having a lower portion having the first critical dimension and an upper portion having the second critical dimension, the contact rail opening physically exposes a surface of the source/drain region, and thereafter a contact rail is formed in the contact rail opening and on the physically exposed surface of the source/drain region.

BRIEF DESCRIPTION OF THE DRAWINGS

FIG. 1A is a top down view of an exemplary semiconductor structure that can be employed in accordance with an embodiment of the present application, the exemplary structure including a plurality of hard mask structures located on a semiconductor substrate, each hard mask structure includes a first dielectric hard mask layer, a second dielectric hard mask layer, and a third dielectric hard mask layer.

FIG. 1B is a cross sectional view of the exemplary semiconductor structure shown in FIG. 1A along X-X, the exemplary structure including a plurality of hard mask structures located on a semiconductor substrate, each hard mask structure includes a first dielectric hard mask layer, a second dielectric hard mask layer, and a third dielectric hard mask layer.

FIG. 1C is a cross sectional view of the exemplary semiconductor structure shown in FIG. 1A along Y-Y, the exemplary structure including a plurality of hard mask structures located on a semiconductor substrate, each hard mask structure includes a first dielectric hard mask layer, a second dielectric hard mask layer, and a third dielectric hard mask layer.

FIG. 2A is a top down view of the exemplary semiconductor structure of FIG. 1A after patterning the plurality of hard mask structures to provide sacrificial fin defining hard mask structures located in an area in which at least one contact rail will be subsequently formed, and active fin defining hard mask structures in an area in which at least one active device will be subsequently formed.

FIG. 2B is a top down view of the exemplary semiconductor structure of FIG. 1A after patterning the plurality of hard mask structures to provide sacrificial fin defining hard mask structures located in an area in which at least one contact rail will be subsequently formed, and active fin defining hard mask structures in an area in which at least one active device will be subsequently formed.

FIG. 2C is a top down view of the exemplary semiconductor structure of FIG. 1C after patterning the plurality of hard mask structures to provide sacrificial fin defining hard mask structures located in an area in which at least one contact rail will be subsequently formed, and active fin defining hard mask structures in an area in which at least one active device will be subsequently formed.

FIG. 9A is a cross sectional view of the exemplary semiconductor structure of FIG. 8A after physically exposing a topmost surface of each sacrificial semiconductor fin and each active semiconductor fin.

FIG. 9B is a cross sectional view of the exemplary semiconductor structure of FIG. 8B after physically exposing a topmost surface of each sacrificial semiconductor fin and each active semiconductor fin.

FIG. 10A is a cross sectional view of the exemplary semiconductor structure of FIG. 9A after forming a top source/drain region on each active semiconductor fin and forming a middle-of-the-line (MOL) level dielectric stack.

FIG. 10B is a cross sectional view of the exemplary semiconductor structure of FIG. 9B after forming a top source/drain region on each active semiconductor fin and forming a middle-of-the-line (MOL) level dielectric stack.

DETAILED DESCRIPTION

Figure 3A:
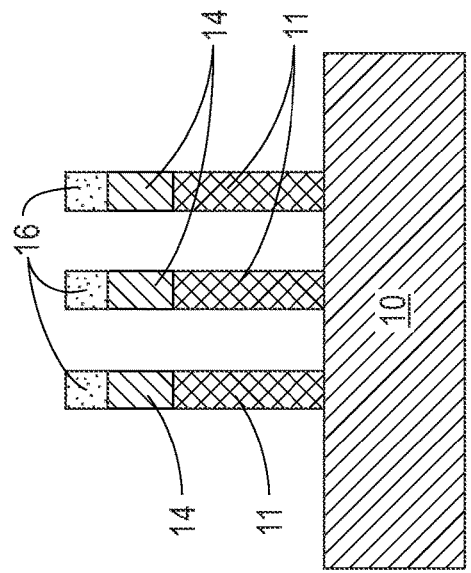
FIG. 3A is a cross sectional view of the exemplary semiconductor structure of FIG. 2B after etching an upper semiconductor material portion of the semiconductor substrate utilizing the sacrificial fin defining hard mask structures and the active fin defining hard mask structures as etch masks to provide a plurality of sacrificial semiconductor fins in the area in which the at least one contact rail will be subsequently formed, and active semiconductor fins in the area in which the at least one active device will be subsequently formed, and removing the third dielectric hard mask layer from each sacrificial semiconductor fin and each active semiconductor fin.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIGS. 1A, 1B and 1C, there are shown an exemplary semiconductor structure that can be employed in accordance with an embodiment of the present application. The exemplary structure shown in FIGS. 1A, 1B and 1C includes a plurality of hard mask structures 12L located on a semiconductor substrate 10, each hard mask structure 12L includes a first dielectric hard mask layer 14L, a second dielectric hard mask layer 16L, and a third dielectric hard mask layer 18L. As can be seen from FIG. 1A, the hard mask structures 12L are spaced apart from each and are oriented parallel to one another. FIG. 1A includes an X-X cut which is along a length-wise direction of one of the hard mask structures 12L, and a Y-Y cut which is in a direction perpendicular to the X-X cut.

The semiconductor substrate 10 can be composed of one or more semiconductor materials. Examples of semiconductor materials that can be used to provide the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments, an entirety of the semiconductor substrate 10 is composed of one or more semiconductor materials. In such embodiments, semiconductor substrate 10 can be referred to a bulk semiconductor substrate.

In some embodiments, the semiconductor substrate 10 can be composed of a semiconductor-on-insulator substrate including from bottom to top, a bottom semiconductor material layer, an insulator material layer, and a top semiconductor material layer. In such an embodiment, the top and bottom semiconductor material layers can be composed of at least one of the semiconductor materials mentioned above, and the insulator material layer can be composed of a dielectric material such as, for example, silicon oxide, and/or boron nitride. In such an embodiment, the top semiconductor material layer is processed to include semiconductor fins.

In some embodiments (and when a nanosheet FET is to be formed), the semiconductor substrate 10 can include alternating layers of a sacrificial semiconductor material and a semiconductor channel material located on a surface thereof. In such an embodiment, the sacrificial semiconductor material is composed of a first semiconductor material and the semiconductor channel material is composed of a second semiconductor material that is compositionally different from the first. For example, the first semiconductor material can be composed of SiGe alloy, while the second semiconductor material can be composed of Si.

The hard mask structures 12L can be formed by first forming blanket layers of a first dielectric hard mask material, a second dielectric hard mask material and a third dielectric hard mask material on a surface of the semiconductor substrate 10. Dielectric hard mask materials for the first, second and third dielectric hard mask materials include, but are not limited to, silicon oxide, silicon nitride and silicon oxynitride. In the present application, the first dielectric hard mask material is compositionally different from the second dielectric hard mask dielectric material, and the first dielectric hard mask material is compositionally the same as, or compositionally different from, the third dielectric hard mask material. The second dielectric hard mask material is compositionally different from both the first dielectric hard mask material and the third dielectric hard mask material. In one example, the first dielectric hard mask material and the third dielectric hard mask material are composed of silicon nitride, and the second dielectric hard mask material is composed of silicon oxide.

The blanket layers of the first dielectric hard mask material, the second dielectric hard mask material and the third dielectric hard mask material can be formed utilizing one or more deposition processes including, but not limited to, chemical vapor deposition (CVD), plasma enhanced chemical vapor deposition (PECVD), or physical vapor deposition (PVD). In some embodiments, the blanket layer of the first dielectric hard mask material can be formed by a thermal process such as, for example, thermal oxidation or thermal nitridation.

After forming the blanket layers of the first dielectric hard mask material, the second dielectric hard mask material and the third dielectric hard mask material, this dielectric hard mask material stack is patterned by lithography and etching to provide the plurality of dielectric hard mask structures 12L on the surface of the semiconductor substrate 10. The lithographic step includes forming a photoresist material on a topmost surface of the blanket layer of third dielectric hard mask material, exposing the photoresist material to a desired pattern of irradiation, and developing the exposed photoresist material. In some embodiments, a masking material including a trilayer of a photoresist, hard mask material, and an organic planarization layer (OPL) can be used. In such an embodiment, multiple lithographic and etching steps can be employed. The etching step includes one or more dry etching processes and/or chemical wet etching processes. In one example, one or more reactive ion etching processes can be used to etch the blanket layers of the first dielectric hard mask material, the second dielectric hard mask material and the third dielectric hard mask material. After etching, a portion of each blanket layer remains. The portion of the blanket layer of first dielectric hard mask material that remains can be referred to as the first dielectric hard mask layer 14L, the portion of the blanket layer of second dielectric hard mask material that remains can be referred to as the second dielectric hard mask layer 16L, and the portion of the blanket layer of third dielectric hard mask material that remains can be referred to as the third dielectric hard mask layer 18L.

Although the present application describes and illustrates the formation of a plurality of dielectric hard mask structures 12L on the surface of the semiconductor substrate 10, the present application can be employed in which only a single dielectric hard mask structure 12L is formed on the surface of the semiconductor substrate 10.

After defining the dielectric hard mask structures 12L or after etching at least one of the blanket layers of dielectric hard mask material, the remaining photoresist material can be removed utilizing a conventional photoresist stripping process such as, for example, ashing.

Referring now to FIGS. 2A, 2B and 2C, there are shown the exemplary semiconductor structure of FIGS. 1A, 1B and 1C, respectively, after patterning the plurality of hard mask structures to provide sacrificial fin defining hard mask structures 14X/16X/18X located in an area in which at least one contact rail will be subsequently formed, and active fin defining hard mask structures 14/16/18 in an area in which at least one active device will be subsequently formed. The patterning of the plurality of hard mask structures 12L can also be referred to as a hard mask cut process. The patterning of the plurality of hard mask structures 12L includes lithography and etching.

Each sacrificial fin defining hard mask structure 14X/16X/18X includes, from bottom to top, a sacrificial fin defining first dielectric hard mask material layer 14X, a sacrificial fin defining second dielectric hard mask material layer 16X, and a sacrificial fin defining third dielectric hard mask material layer 18X. Each active fin defining hard mask structures 14/16/18 includes, from bottom to top, an active fin defining first dielectric hard mask material layer 14, an active fin defining second dielectric hard mask material layer 16, and an active fin defining third dielectric hard mask material layer 18. It is noted that the sacrificial fin defining first dielectric hard mask material layer 14X and the active fin defining first dielectric hard mask material layer 14 are remaining portions of the first dielectric hard mask material layer 14L, the sacrificial fin defining second dielectric hard mask material layer 16X and the active fin defining second dielectric hard mask material layer 16 are remaining portions of the second dielectric hard mask material layer 16L, and the sacrificial fin defining third dielectric hard mask material layer 18X and the active fin defining third dielectric hard mask material layer 18 are remaining portions of the third dielectric hard mask material layer 18L.

Figure 3B:
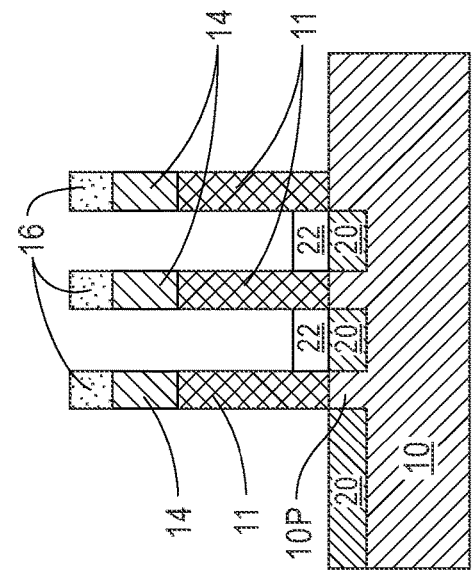
FIG. 3B is a cross sectional view of the exemplary semiconductor structure of FIG. 2C after etching an upper semiconductor material portion of the semiconductor substrate utilizing the sacrificial fin defining hard mask structures and the active fin defining hard mask structures as etch masks to provide a plurality of sacrificial semiconductor fins in the area in which the at least one contact rail will be subsequently formed, and active semiconductor fins in the area in which the at least one active device will be subsequently formed, and removing the third dielectric hard mask layer from each sacrificial semiconductor fin and each active semiconductor fin.

Referring now to FIGS. 3A and 3B, there are illustrated the exemplary semiconductor structure of FIGS. 2B and 2C, respectively, after etching an upper semiconductor material portion of the semiconductor substrate 10 utilizing the sacrificial fin defining hard mask structures 14X/16X/18X and the active fin defining hard mask structures 14/16/18 as etch masks to provide a plurality of sacrificial semiconductor fins 11X in the area in which the at least one contact rail will be subsequently formed, and active semiconductor fins 11 in the area in which the at least one active device will be subsequently formed, and removing the third dielectric hard mask layer 18X, 18 from each sacrificial semiconductor fin 11X and each active semiconductor fin 11. The active semiconductor fins 11 can be referred to as semiconductor channel material structures.

In one embodiment, the etch that provides the sacrificial semiconductor fins 11X and the active semiconductor fins 11 includes a dry etching process such, for example, reactive ion etching, ion beam etching or e-beam etching.

As used herein, a "semiconductor fin" refers to a semiconductor structure including a pair of vertical sidewalls that are parallel to each other. As used herein, a surface is "vertical" if there exists a vertical plane from which the surface does not deviate by more than three times the root mean square roughness of the surface.

Each sacrificial semiconductor fin 11X has a width that is less than a width of each active semiconductor fin 11; the height of each sacrificial semiconductor fin 11X is the same as the height of each active semiconductor fin. In one embodiment, each sacrificial semiconductor fin 11X has a width from 3 nm to 25 nm, each active semiconductor fin has a width from 25 nm to 100 nm, and the height of the sacrificial semiconductor fins 11X and the active semiconductor fins 11 can be from 20 nm to 100 nm. In the present application, the width of a structure can also be referred to a critical dimension, CD, of the structure. Thus, and in one embodiment, each sacrificial semiconductor fin has a CD from 3 nm to 25 nm.

Other semiconductor fin heights and/or widths that are lesser than, or greater than, the ranges mentioned herein can also be used in the present application.

In some embodiments, and during the etch used to define the sacrificial semiconductor fins 11X and active semiconductor fins 11, the sacrificial fin defining third dielectric hard mask material layers 18X, and the active fin defining third dielectric hard mask material layers 18 can be removed from the structure. In other embodiments, the sacrificial fin defining third dielectric hard mask material layers 18X, and the active fin defining third dielectric hard mask material layers 18 can be removed after forming the sacrificial semiconductor fins 11X and active semiconductor fins 11 utilizing a separate material removal process than that used to define the sacrificial semiconductor fins 11X and active semiconductor fins 11. In either embodiment, the sacrificial fin defining second dielectric hard mask material layers 16X, and the active fin defining second dielectric hard mask material layers 18 are physically exposed as is shown in FIGS. 3A and 3B.

Figure 4A:
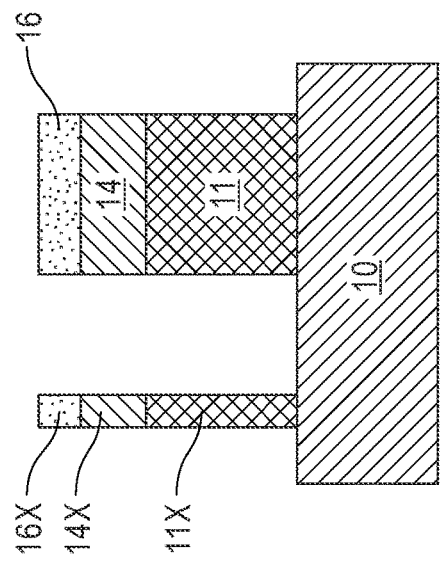
FIG. 4A is a cross sectional view of the exemplary semiconductor structure of FIG. 3A after forming bottom source/drain regions, and a bottom spacer on each bottom source/drain region.
Figure 4B:
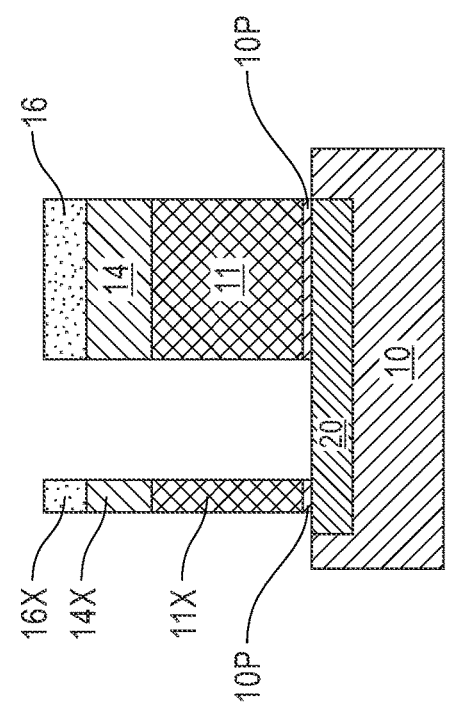
FIG. 4B is a cross sectional view of the exemplary semiconductor structure of FIG. 3B after forming bottom source/drain regions, and a bottom spacer on each bottom source/drain region.

Referring now to FIGS. 4A and 4B, there are illustrated the exemplary semiconductor structure of FIGS. 3A and 3B, respectively, after forming bottom source/drain regions 20, and a bottom spacer 22 on each bottom source/drain region 20.

In some embodiments, and prior to forming the bottom source/drain regions 20, the exposed surface of the semiconductor substrate 10, not including the sacrificial semiconductor fins 11X and active semiconductor fins 11, can be recessed to provide a pedestal portion 10P of the semiconductor substrate 10 located beneath each sacrificial semiconductor fin 11X and each active semiconductor fin 11. The pedestal portion 10P of the semiconductor substrate 10 that is located beneath sacrificial semiconductor fin 11X has an outermost sidewall that is vertically aligned to the outermost sidewall of the sacrificial semiconductor fin 11X, likewise the pedestal portion 10P of the semiconductor substrate 10 that is located beneath active semiconductor fin 11 has an outermost sidewall that is vertically aligned to the outermost sidewall of the active semiconductor fin 11. The recessing of the semiconductor substrate 10 can include an etching process such as, for example, a dry etching process or wet chemical etching process. The pedestal portion 10P that is formed can have a height of from 2 nm to 10 nm.

Bottom source/drain regions 20 are then formed utilizing techniques that are well known to those skilled in the art. In one embodiment, the bottom source/drain regions 20 can be formed utilizing an epitaxial growth process in which a doped semiconductor material is epitaxially grown on the surface of semiconductor substrate 10. The doped semiconductor material can be an n-type doped semiconductor material or a p-type doped semiconductor material. In the present application, the terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth can be performed at a temperature of from 300° C. to 800° C. The epitaxial growth can be performed utilizing any well-known precursor gas or gas mixture. Carrier gases like hydrogen, nitrogen, helium and argon can be used. A dopant (n-type or p-type, as defined below) is typically added to the precursor gas or gas mixture.

The semiconductor material that can be epitaxially deposited in this embodiment to provide the bottom source/drain regions 20 includes any of the semiconductor materials mentioned above for the semiconductor substrate 10. In some embodiments, the semiconductor material that can be epitaxially deposited in this embodiment is composed of silicon. The semiconductor material that can be epitaxially deposited in this embodiment to provide the bottom source/drain regions 20 can be compositionally the same as, or compositionally different from, each sacrificial semiconductor fin 11X and each active semiconductor fin 11 and/or the semiconductor substrate 10.

The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within the semiconductor material that provides the bottom S/D region can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of p-type dopant within the semiconductor material that provides the bottom S/D region can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived.

The bottom spacer 22 can now be formed. The bottom spacer 22 has a sidewall that directly contacts a lower portion of a sidewall of each active semiconductor fin 11. The bottom spacer 22 can be composed of any dielectric spacer material including, for example, silicon dioxide, silicon nitride, or silicon oxynitride. The bottom spacer 22 can be formed utilizing a deposition process such as, for example, CVD or PECVD. In some instances, an etch back process can follow the deposition of the dielectric spacer material that provides the bottom spacer 22. The bottom spacer 22 can have a thickness from 5 nm to 15 nm. Other thicknesses that are lesser than, or greater than, the aforementioned thickness range can also be employed in the present application as the thickness of the bottom spacer 22 as long as the height of the bottom spacer 22 is not greater than the height of the active semiconductor fins 11.

In some embodiments (not shown), a drive-in anneal can now be performed to cause diffusion of dopants (n-type or p-type) from the bottom S/D region 20 into the pedestal portion 10P of the semiconductor substrate 10. In some embodiments, the drive-anneal can be formed prior to forming the bottom spacer 20, or any other time after formation of the bottom source/drain regions 20. Diffusion of dopants (n-type or p-type) into the semiconductor substrate 10 that is located beneath the bottom source/drain region 20 also occurs during this drive-in anneal.

Figure 5A:
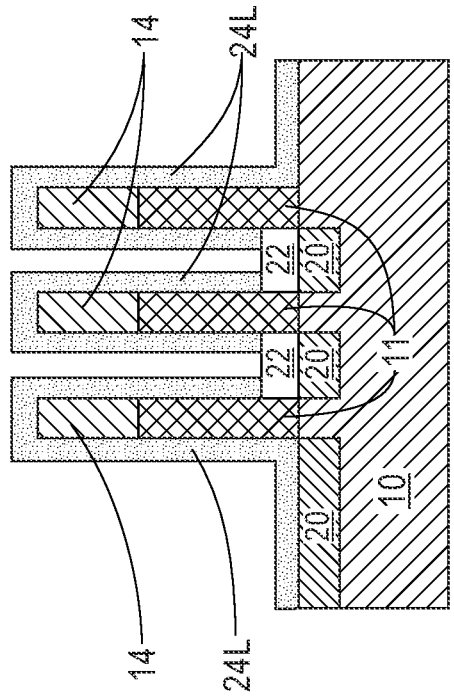
FIG. 5A is a cross sectional view of the exemplary semiconductor structure of FIG. 4A after removing the second dielectric hard mask layer from each sacrificial semiconductor fin and each active semiconductor fin and forming a gate dielectric material layer and a work function metal layer.
Figure 5B:
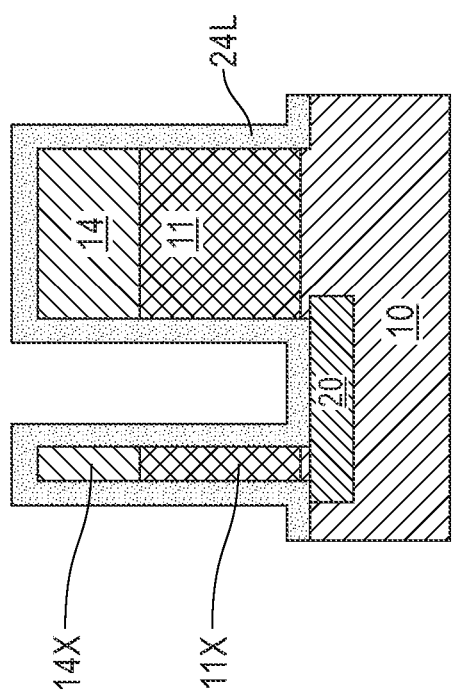
FIG. 5B is a cross sectional view of the exemplary semiconductor structure of FIG. 4B after removing the second dielectric hard mask layer from each sacrificial semiconductor fin and each active semiconductor fin and forming a gate dielectric material layer and a work function metal layer.

Referring now to FIGS. 5A and 5B, there are illustrated the exemplary semiconductor structure of FIGS. 4A and 4B, respectively, after removing the second dielectric hard mask layer (i.e., the sacrificial fin defining second dielectric hard mask material layer 16X and the active fin defining second dielectric hard mask material layer 16) from each sacrificial semiconductor fin 11X and each active semiconductor fin 11 and forming a gate dielectric material layer and a work function metal layer (i.e., a gate conductor material). In the present application, the gate dielectric material layer and the work function metal layer are collectively referred to a functional gate material containing layer 24L. In the functional gate material containing layer 24L, the gate dielectric material layer is located beneath the work function metal layer.

The removal of the sacrificial fin defining second dielectric hard mask material layer 16X and the active fin defining second dielectric hard mask material layer 16 from each sacrificial semiconductor fin 11X and each active semiconductor fin 11, respectively, can be performed utilizing a material removal process such as, for example, etching or planarization. After removing the sacrificial fin defining second dielectric hard mask material layer 16X and the active fin defining second dielectric hard mask material layer 16 from each sacrificial semiconductor fin 11X and each active semiconductor fin 11, the sacrificial fin defining first dielectric hard mask material layers 14X, and the active fin defining first dielectric hard mask material layers 14 are now physically exposed.

The gate dielectric material layer of the functional gate material containing layer 24L typically includes a high-k gate dielectric material. The term "high-k gate dielectric material" denotes a gate dielectric material having a dielectric constant greater than 4.0; all dielectric constants mentioned herein are measured in a vacuum. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The gate dielectric material layer can be formed by any deposition process including, for example, CVD, PECVD, PVD, sputtering, or atomic layer deposition (ALD). In one embodiment of the present application, the gate dielectric material layer can have a thickness in a range from 1 nm to 10 nm. Other thicknesses that are lesser than, or greater than, the aforementioned thickness range can also be employed for gate dielectric material layer. The gate dielectric material layer typically has a conformal thickness. The term "conformal" denotes that a material layer has a vertical thickness along horizontal surfaces that is substantially the same (i.e., within ±5%) as the lateral thickness along vertical surfaces.

In some embodiments. the work function metal layer of the functional gate material containing layer 24L is an n-type work function metal that effectuates an n-type threshold voltage shift. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal ranges from 4.1 eV to 4.3 eV.

In one embodiment, the n-type work function metal is composed of at least one of titanium aluminum, titanium aluminum carbide, tantalum nitride, titanium nitride, hafnium nitride, hafnium silicon, or combinations and thereof. The n-type work function metal can be a single material layer or a multi-material layer.

In some embodiments, the work function metal layer of the functional gate material containing layer 24L is a p-type work function metal that effectuates a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal can be composed of titanium and its nitride or carbide. In one specific embodiment, the p-type work function metal is composed of titanium nitride. The p-type work function metal can also be composed of titanium aluminum nitride, tantalum nitride, ruthenium, platinum, molybdenum, cobalt, and alloys and combinations or thereof. The p-type work function metal can be a single material layer or a multi-material layer.

The work function metal layer can be formed utilizing a deposition process such as, for example, CVD, PECVD, PVD sputtering, or ALD. In one embodiment, the work function metal layer can have a thickness in a range from 1 nm to 10 nm. Other thicknesses that are lesser than, or greater than, the aforementioned thickness range can also be employed for each of work function metal layer. The work function metal layer typically has a conformal thickness.

Figure 6A:
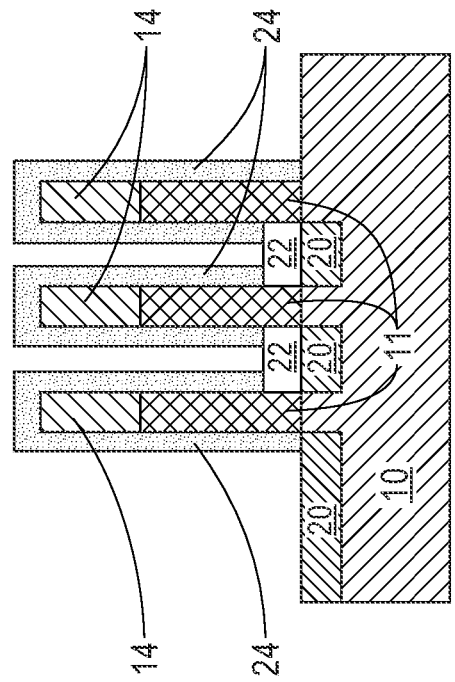
FIG. 6A is a cross sectional view of the exemplary semiconductor structure of FIG. 5A after removing the gate dielectric material layer and the work function metal layer from the area including the plurality of sacrificial semiconductor fins.
Figure 6B:
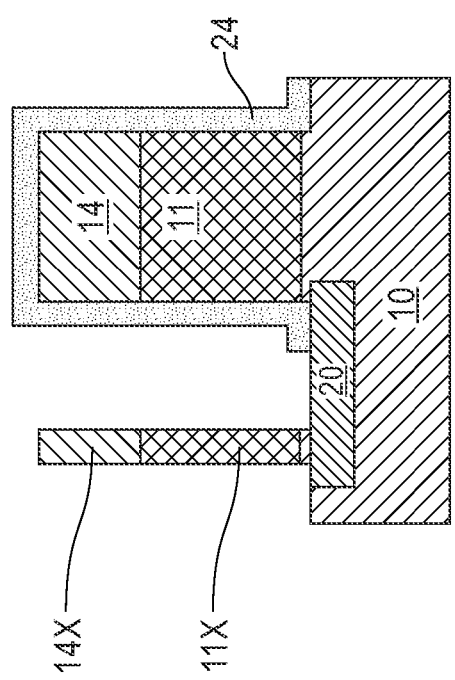
FIG. 6B is a cross sectional view of the exemplary semiconductor structure of FIG. 5B after removing the gate dielectric material layer and the work function metal layer from the area including the plurality of sacrificial semiconductor fins.

Referring now to FIGS. 6A and 6B, there are illustrated the exemplary semiconductor structure of FIGS. 5A and 5B, respectively, after removing the gate dielectric material layer and the work function metal layer (i.e., functional gate material containing layer 24L) from the area including the plurality of sacrificial semiconductor fins 11X. The removal of the functional gate material containing layer 24L from the area including the plurality of sacrificial semiconductor fins 11X includes forming a patterned mask (not shown) that protects the device area in which functional gate material containing layer 24L is to remain, and thereafter etching the functional gate material containing layer 24L utilizing one or more etching steps. After the one or more etching steps have been performed, the patterned mask can be removed from the structure utilizing any conventional mask removal process. As is shown in FIG. 6A, the sidewalls of the sacrificial semiconductor fins 11X are free of any functional gate material containing layer 24L. The remaining functional gate material containing layer 24L in the active device region containing the active semiconductor fins 11 can now be referred to as precursor functional gate material containing structure 24. The precursor functional gate material containing structure 24 includes a remaining portion of the gate dielectric material layer and a remaining portion of the work function metal layer.

Figure 7A:
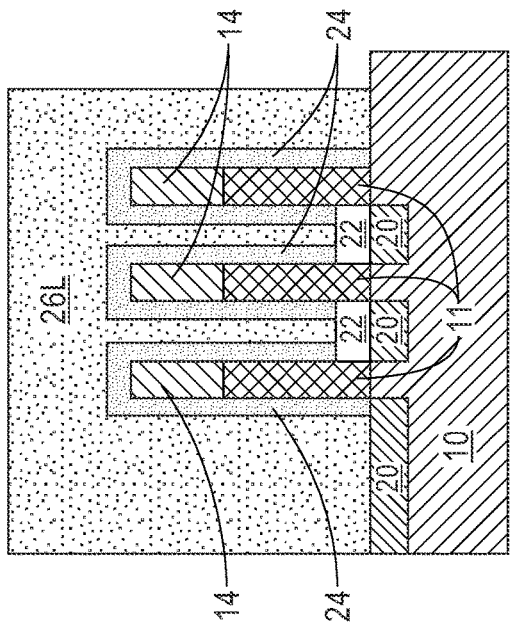
FIG. 7A is a cross sectional view of the exemplary semiconductor structure of FIG. 6A after forming an interlayer dielectric (ILD) material layer laterally adjacent to, and above, each sacrificial semiconductor fin and each active semiconductor fin.
Figure 7B:
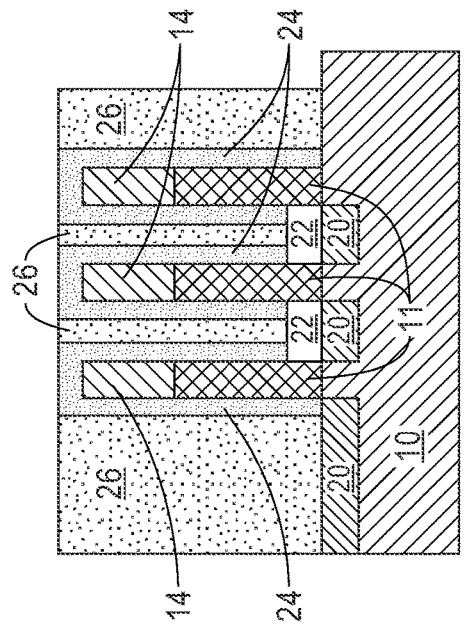
FIG. 7B is a cross sectional view of the exemplary semiconductor structure of FIG. 6B after forming an interlayer dielectric (ILD) material layer laterally adjacent to, and above, each sacrificial semiconductor fin and each active semiconductor fin.

Referring now to FIGS. 7A and 7B, there are illustrated the exemplary semiconductor structure of FIGS. 6A and 6B, respectively, after forming an interlayer dielectric (ILD) material layer 26L laterally adjacent to, and above, each sacrificial semiconductor fin 11X and each active semiconductor fin 11. The ILD material layer 26L can be composed of, for example, silicon dioxide, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In one embodiment, ILD material layer 26L can be formed utilizing a deposition process including, for example, chemical vapor deposition (CVD), plasma enhanced chemical vapor deposition (PECVD), evaporation or spin-on coating.

Figure 8A:
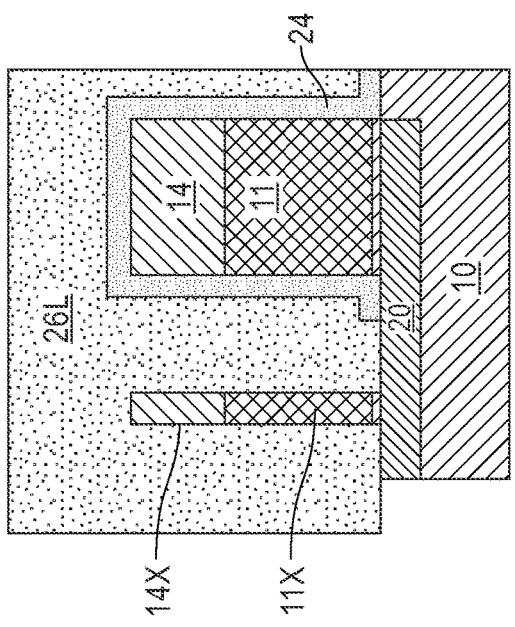
FIG. 8A is a cross sectional view of the exemplary semiconductor structure of FIG. 7A after removing the interlayer dielectric (ILD) material layer from the top of each sacrificial semiconductor fin and each active semiconductor fin.
Figure 8B:
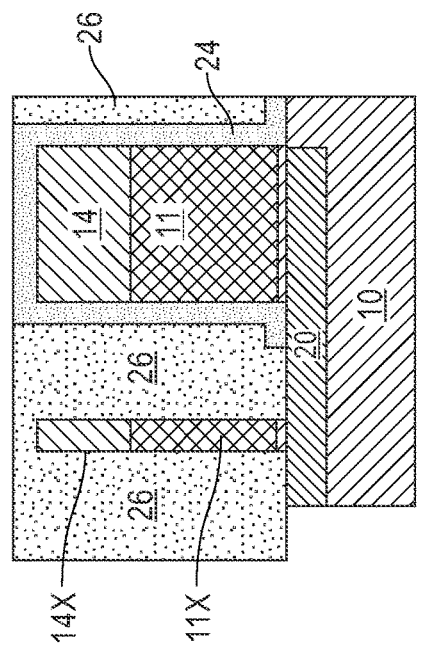
FIG. 8B is a cross sectional view of the exemplary semiconductor structure of FIG. 7B after removing the interlayer dielectric (ILD) material layer from the top of each sacrificial semiconductor fin and each active semiconductor fin.

Referring now to FIGS. 8A and 8B, there are illustrated the exemplary semiconductor structure of FIGS. 7A and 7B, respectively, after removing the interlayer dielectric (ILD) material layer 26L from the top of each sacrificial semiconductor fin 11X and each active semiconductor fin 11. The removal of the ILD material layer 26L can include a planarization process such as, for example, chemical mechanical polishing (CMP). The remaining ILD material layer 26L can be referred to as a recessed ILD material layer 26. As is shown, the recessed ILD material layer 26 has a topmost surface that is coplanar with a topmost surface of the precursor functional gate material containing structure 24 that is present above each active semiconductor fin 11.

Referring now to FIGS. 9A and 9B, there are illustrated the exemplary semiconductor structure of FIGS. 8A and 8B, respectively, after physically exposing a topmost surface of each sacrificial semiconductor fin 11X and each active semiconductor fin 11. This step of the present application includes first removing, utilizing a first etching process, the precursor functional gate material containing structure 24 from a topmost surface of each active fin defining first dielectric hard mask layer 14, and then removing, utilizing a second etching process, each active fin defining first dielectric hard mask layer 14 and each sacrificial fin defining first dielectric hard mask layer 14X.

After removing the active fin defining first dielectric hard mask layer 14 from the structure, the precursor functional gate material containing structure 24 is recessed to provide a functional gate structure 24S along the sidewalls of each active semiconductor fin 11. As is shown, the functional gate structure 24S has a topmost surface that is coplanar with a topmost surface of the active semiconductor fin 11. This recessing step includes one or more etching processes.

Referring now to FIGS. 10A and 10B, there are illustrated the exemplary semiconductor structure of FIGS. 9A and 9B, respectively, after forming a top source/drain region 30 on each active semiconductor fin 11 and forming a middle-of-the-line (MOL) level dielectric stack 32/34.

The top source/drain regions 30 are formed utilizing an epitaxial growth process as mentioned above for forming the bottom source/drain regions 20; a mask can be used to protect each sacrificial semiconductor fin 11X during formation of the top source/drain regions 30. The top source/drain regions 30 comprise a doped semiconductor material (i.e., a semiconductor material and a dopant). The semiconductor material that provides the top source/drain regions 30 can include one of the semiconductor materials mentioned above for semiconductor substrate 10. The semiconductor material that provides the top source/drain region 30 can be compositionally the same as, or compositionally different from, the semiconductor material that provides the active semiconductor fins 11 and/or the bottom source/drain regions 20. The dopant that is present in the top source/drain regions 30 can include a p-type dopant or n-type dopant as mentioned above for the bottom source/drain regions 20. The concentration of the n-type dopant or p-type dopant within the top source/drain regions 30 can be within the ranges mentioned above for the bottom source/drain regions 20. It is noted that exemplary structure shown in FIGS. 10A-10B now includes a functional gate structure 24S that is located laterally adjacent a sidewalls of each active semiconductor fin 11 (i.e., a semiconductor channel material structure). A source/drain region (i.e., bottom source/drain 20 and top source/drain region 30 is located at each end of the each active semiconductor fin 11 (i.e., a semiconductor channel material structure).

After forming the top source/drain regions 30, the mask used to protect the sacrificial semiconductor fins 11X can be removed and additional ILD material is formed. The additional ILD material is typically, but not necessarily always, compositionally the same as the dielectric material that provides the ILD material layer 26L. The additional ILD material can be formed by utilizing one of the deposition processes mentioned above for forming the ILD material layer 26L. A planarization process can follow the deposition of the additional dielectric material. Collectively the additional ILD material and the recessed ILD material layer 26 can be referred to as ILD material 27.

The MOL level dielectric stack 32/34 is then formed atop the ILD material 27. The MOL level dielectric stack 32/34 includes a first dielectric material layer 32 and a second dielectric material layer 34. The first and second dielectric material layers 32, 34 are compositionally different for each other, and can include one of the dielectric hard mask materials mentioned above. In one example, the first dielectric material layer 32 can be comprised of silicon nitride, and the second dielectric material layer 34 can be composition of silicon oxide. The first and second dielectric material layers 32, 34 can be formed utilizing any well known deposition process such as, for example, CVD, PECVD, or PVD.

The first dielectric material layer 32 can have a thickness from 5 nm to 20 nm; although other thicknesses for the first dielectric material layer 32 are contemplated and can be used in the present application as the thickness of the first dielectric material layer 32. The second dielectric material layer 34 can have a thickness from 20 nm to 100 nm; although other thicknesses for the second dielectric material layer 34 are contemplated and can be used in the present application as the thickness of the second dielectric material layer 34.

Figure 11A:
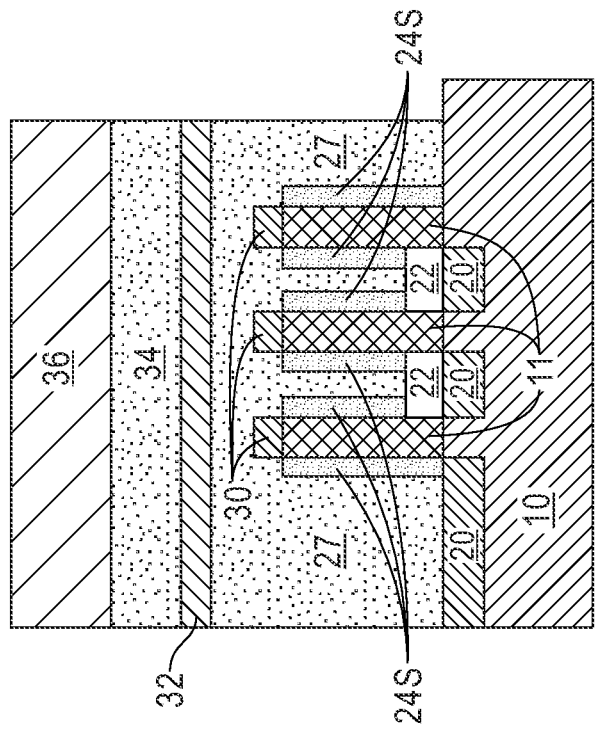
FIG. 11A is a cross sectional view of the exemplary semiconductor structure of FIG. 10A after forming a patterned contact rail mask on the MOL level dielectric stack, and then forming a plurality of openings in the MOL level dielectric stack, each opening physically exposing a topmost surface of one of the sacrificial semiconductor fins.
Figure 11B:
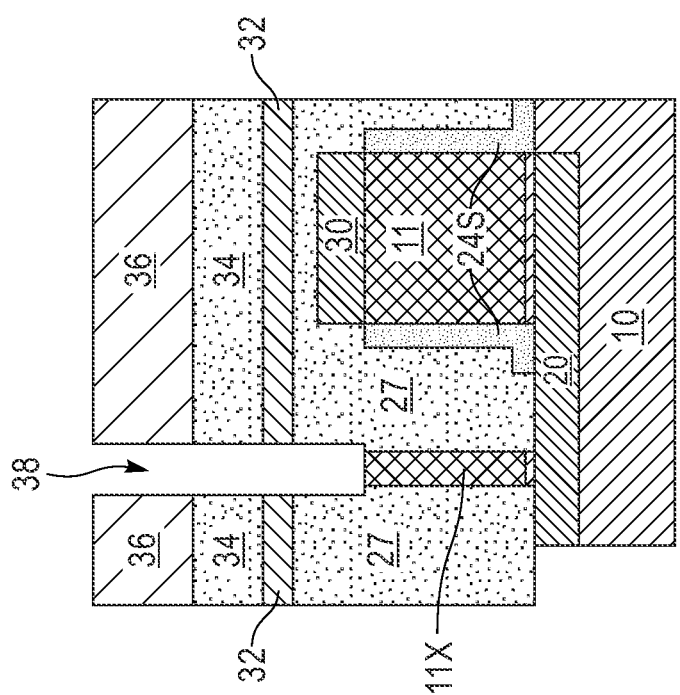
FIG. 11B is a cross sectional view of the exemplary semiconductor structure of FIG. 10B after forming a patterned contact rail mask on the MOL level dielectric stack, and then forming a plurality of openings in the MOL level dielectric stack, each opening physically exposing a topmost surface of one of the sacrificial semiconductor fins.

Referring now to FIGS. 11A and 11B, there are illustrated the exemplary semiconductor structure of FIGS. 10A and 10B, respectively, after forming a patterned contact rail mask 36 on the MOL level dielectric stack 32/34, and then forming a plurality of openings 38 in the MOL level dielectric stack 32/34, each opening 38 physically exposing a topmost surface of one of the sacrificial semiconductor fins 11X. The patterned contact rail mask 36 is composed of any masking material, and the patterned contact rail mask 36 can be formed by deposition of the masking material, followed by at least a lithographic patterning step which can include etching. After forming the patterned contact rail mask 36, discreet (i.e., individual) openings 38 are formed through the MOL level dielectric stack 32/34 physically exposing a topmost surface an underlying sacrificial semiconductor fins 11X. These discrete openings 38 are not connected to each other.

The discrete openings 38 can be formed utilizing one or more etching process. These individual openings 28 have a critical dimension, CD, that is within lithographic limits. That is the individual openings 28 typically have a CD of greater than 25 nm. The CD of the individual openings 28 is typically greater than the CD of the underlying sacrificial semiconductor fins 11X; the CD of the sacrificial semiconductor fins 11X is 25 nm or less (in one embodiment the CD of the sacrificial semiconductor fins 11X is 10 nm or less).

Figure 12A:
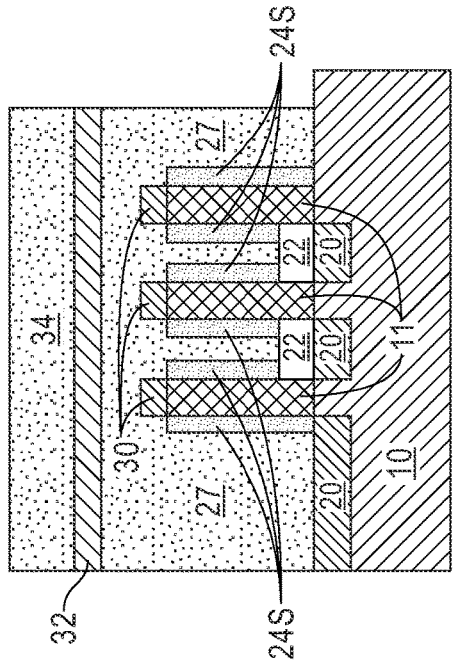
FIG. 12A is a cross sectional view of the exemplary semiconductor structure of FIG. 11A after removing each physically exposed sacrificial semiconductor fin to provide a contact rail opening that physically exposes a portion of the bottom source/drain region.
Figure 12B:
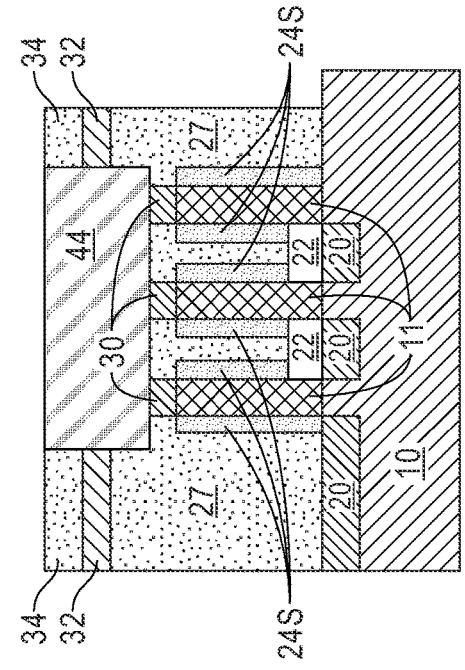
FIG. 12B is a cross sectional view of the exemplary semiconductor structure of FIG. 11B after removing each physically exposed sacrificial semiconductor fin to provide a contact rail opening that physically exposes a portion of the bottom source/drain region.

Referring now to FIGS. 12A and 12B, there are illustrated the exemplary semiconductor structure of FIGS. 11A and 11B, respectively, after removing each physically exposed sacrificial semiconductor fin 11X to provide a contact rail opening 40 that physically exposes a portion of the bottom source/drain region 20. The sacrificial semiconductor fins 11X can be removed utilizing an etching process that is selective in removing the sacrificial semiconductor fins 11X. Each contact rail opening 40 that is formed is non-connected (i.e., the contact rail openings 40 are discrete) and has a lower portion having a first CD, CD1, and an upper portion that has a second CD, CD2, that is greater than the first CD. In the present application, the first CD, CD1, is equal to the CD of the sacrificial semiconductor fin 11X, while the second CD, CD2, is equal to the CD of the openings 38.

Figure 13A:
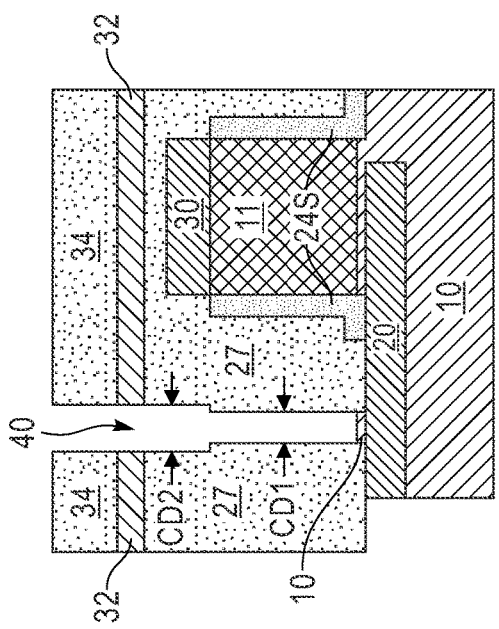
FIG. 13A is a cross sectional view of the exemplary semiconductor structure of FIG. 12A after forming a contact rail in the contact rail opening, a top source/drain contact structure contacting the top source/drain region, and a gate contact structure contacting a remaining portion of the work function metal layer.
Figure 13B:
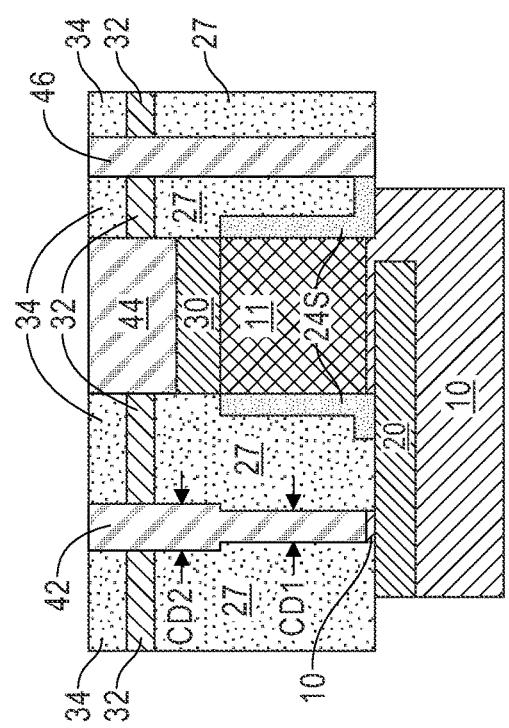
FIG. 13B is a cross sectional view of the exemplary semiconductor structure of FIG. 12B forming a contact railing the contact rail opening, a top source/drain contact structure contacting the top source/drain region, and a gate contact structure contacting a remaining portion of the work function metal layer.

Referring now to FIGS. 13A and 13B, there are illustrated the exemplary semiconductor structure of FIGS. 12A and 12B, respectively, after forming a contact rail 42 in the contact rail opening 40, a top source/drain contact structure 44 contacting the top source/drain region 30, and a gate contact structure 46 contacting a remaining portion of the work function metal layer (i.e., an upper portion of the functional gate structure 24S). The top source/drain contact structure 44 is formed in a top source/drain contact opening (not specifically shown) that is formed in the MOL level dielectric stack 32/34 and ILD material 27, while the gate contact structure 46 is formed in gate contact opening (not specifically shown) that is also formed in the MOL level dielectric stack 32/34 and ILD material 27. The top source/drain contact opening and the gate contact opening can be formed by lithography and etching.

In one embodiment, the contact rail 42 is formed prior to forming the top source/drain contact structure 44 and the gate contact structure 46. In another embodiment, the contact rail 42 is formed simultaneously with the forming of the top source/drain contact structure 44, and the gate contact structure 46. In yet a further embodiment, the contact rail 42 is formed after forming the top source/drain contact structure 44 and the gate contact structure 46; in such a process a block mask needs to be formed protecting the contact rail opening 40 during the forming of the top source/drain contact structure 44 and the gate contact structure 46.

Each of the contact rail 42, top source/drain contact structure 44 and gate contact structure 46 includes at least a contact metal including, but not limited to, tungsten (W), copper (Cu), aluminum (Al), cobalt (Co), ruthenium (Ru), molybdenum (Mo), osmium (Os), iridium (Ir), rhodium (Rh) or an alloy thereof. The contact metal that provides the contact rail 42 can be compositionally the same as, or compositionally different from the top source/drain contact structure 44 and/or gate contact structure 46. In one embodiment, the contact rail 42, the top source/drain contact structure 44 and gate contact structure 46 include a same contact metal. The contact metal can be formed by any suitable deposition method such as, for example, ALD, CVD, PVD or plating.

In some embodiments and prior to forming the contact rail 42, top source/drain contact structure 44 and gate contact structure 46, one or more contact diffusion barrier layers (not shown) can be formed in the respectively openings used to form the contact rail 42, top source/drain contact structure 44 and gate contact structure 46. In one or more embodiments, the contact diffusion barrier layer (not shown) can include a diffusion barrier material such as the diffusion barrier material mentioned above. The contact diffusion barrier layer can be formed utilizing a conformal deposition process including CVD or ALD. The contact diffusion barrier layer that is formed can have a thickness ranging from 1 nm to 5 nm, although lesser and greater thicknesses can also be employed.

Each contact rail 42 that is formed is a discrete contact rail that has a lower portion having the first CD, CD1, mentioned above, and an upper portion having the second CD, CD2, as defined above. By "discrete contact rail", it is meant that the source/drain are connected by multiple small contact instead of a long contact rail bar like describe in FIG. 14. The litho mask for those contact have a critical dimension of a ratio 1:1 and will connect individually each of the sacrificial semiconductor fins 11X. Each contact rail 42 is self-aligned and is positioned on a surface of the bottom source/drain region 20 that extends into the area including the contact rail 42. No overlay error exists with the contact rail 42 of the present application. Each contact rail 42 has a topmost surface that is coplanar with each other as well as being coplanar a topmost surface of each of the top source/drain contact structure 44, the gate contact structure 46, and the second dielectric layer 34 of the MOL level dielectric stack 32/34. As is shown in FIG. 13A, the contact rail 42, the source/drain contact structure 44, and the gate contact structure 46 are embedded within a dielectric material structure including the ILD material 27, and the MOL level dielectric stack 32/34.

In some embodiments, a planarization process can be employed to remove the MOL level dielectric stack 32/34, an upper portion of each the contact rail 42, the source/drain contact structure 44, and the gate contact structure 46, stopping on a surface of the ILD material 27. In such an embodiment, the contact rail 42, the source/drain contact structure 44, and the gate contact structure 46 have topmost surfaces that are coplanar with each as well as being coplanar with a topmost surface of the ILD material 27.

FIGS. 13A-13B illustrates an exemplary semiconductor device in accordance with the present application. The exemplary device shown in FIGS. 13A-13B includes a functional gate structure 24S including a first source/drain region (bottom source/drain region 2) located a first end of a semiconductor channel material structure (i.e., active semiconductor fin 11) and a second source/drain region (i.e., top source/drain region 30) located at a second end of the semiconductor channel material structure (i.e., active semiconductor fin 11). The device further includes a contact rail 42 located laterally adjacent to the functional gate structure 24S and contacting a surface of the first source/drain region (i.e., the bottom source/drain region 20) of the functional gate structure 24S. In this illustrated embodiment, the contact rail 42 has a lower portion having a first CD, CD1, and an upper portion having a second CD, CD2, that is greater than the first CD, CD1.

Figure 14:
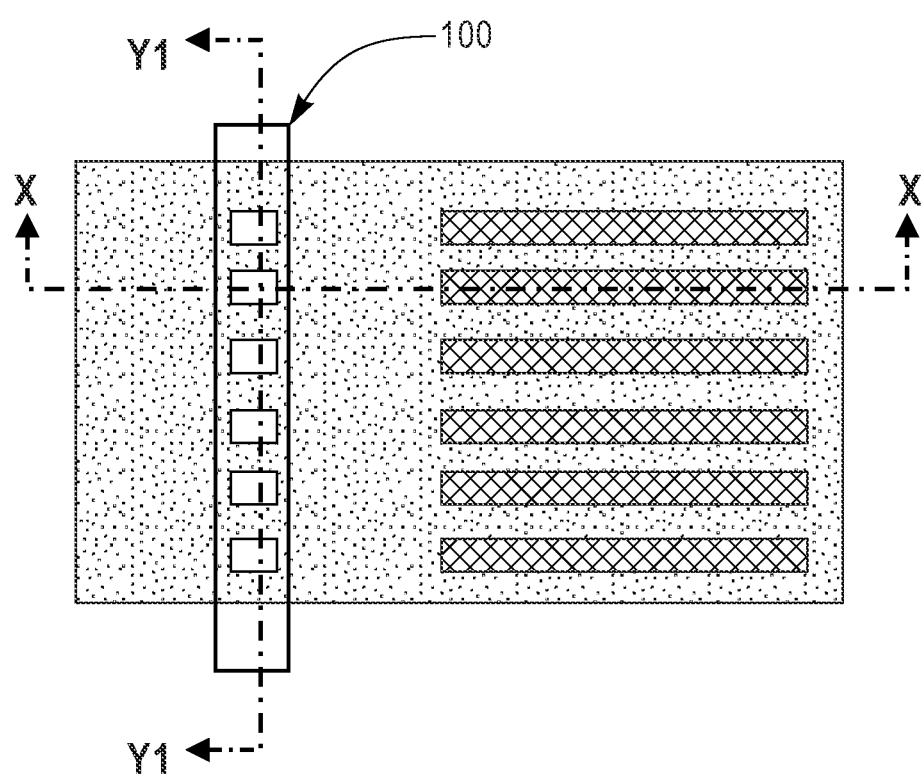
FIG. 14 is a top down view highlighting a contact rail bar area of an exemplary structure.

Referring now to FIG. 14, there is a top down view highlighting a contact rail bar area 100 on the exemplary structure in which a large via bar contact rail will be formed. This drawing includes cut X-X, as shown in FIG. 1, as well as Y1-Y1 which is along the length of the highlighted contact rail bar area. By "via bar contact rail", it is meant that the mask defining the contact bar has a critical dimension with an aspect ratio greater that 1 by 2 and will connect within the same structure more than one sacrificial semiconductor fin 11X.

Figure 15A:
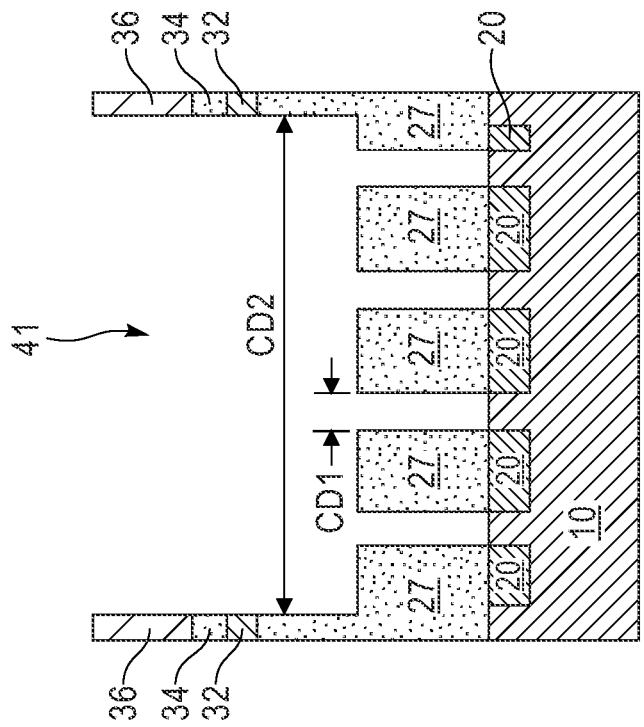
FIG. 15A is a cross sectional view of an exemplary structure shown in FIG. 10A and along X-X shown in FIG. 14 after forming a patterned contact rail mask on the MOL level dielectric stack, and then forming a single opening in the MOL level dielectric stack, the single opening exposing a topmost surface of each of the sacrificial semiconductor fins, removing each sacrificial semiconductor fin and partially removal of the interlayer dielectric material in the single opening.

Referring now to FIG. 15A, there is illustrated the exemplary structure shown in FIG. 10A and along X-X shown in FIG. 14 after forming a patterned contact rail mask 36 on the MOL level dielectric stack 32/34, and then forming a single opening (upper portion of 41) in the MOL level dielectric stack 32/34 and the MOL dielectric material 27, the single opening exposing a topmost surface of each of the sacrificial semiconductor fins 11X, removing each sacrificial semiconductor fin 11X. In some embodiments, a portion of the ILD material 27 can be removed as well. For example, it is possible to etch 33%, 50% or even 66% of the dielectric material 27 In this embodiment, a highly selective etch can be used to form the single contact rail opening 41.

Figure 15B:
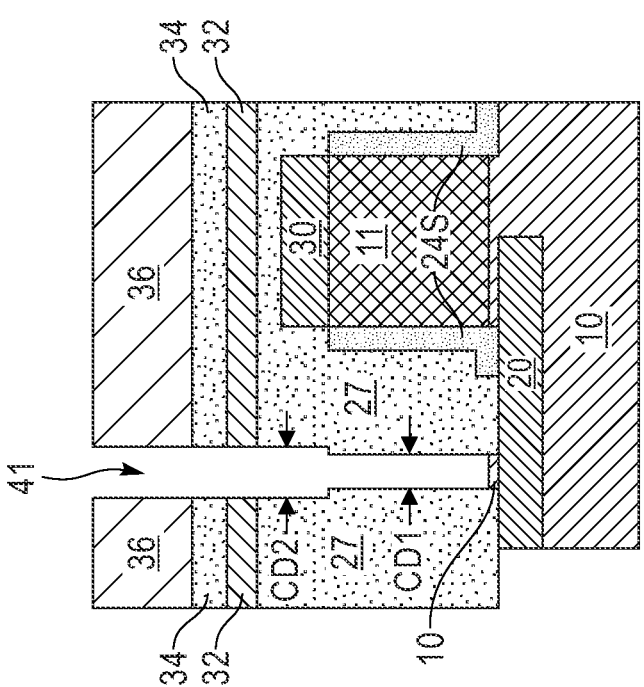
FIG. 15B is a cross sectional view of the exemplary structure shown in FIG. 15A but along Y1-Y1 shown in FIG. 14.

Such processing provides a single contact rail opening 41 having a lower portion with a first CD, CD1, and an upper portion having a second CD, CD2. In this embodiment, the first CD, CD1 is equal to the CD of the sacrificial semiconductor fins 11X, and the second CD, CD2 is equal to the bar area that is along Y1-Y1 shown in FIG. 14. The Y1-Y1 cut for the exemplary structure shown in FIG. 15A is illustrated in FIG. 15B of the present application. It noted that in FIG. 15B at least 33% of the dielectric material 37 is removed during this step of the present application.

The exemplary structure shown in FIGS. 15A-15B can be processed to include the contact rail 42, a top source/drain contact structure 44, and gate contact structure 46 utilizing the processes sets mentioned above in forming the exemplary structure shown in FIGS. 13A-13B.

Figures 16A, 16B:
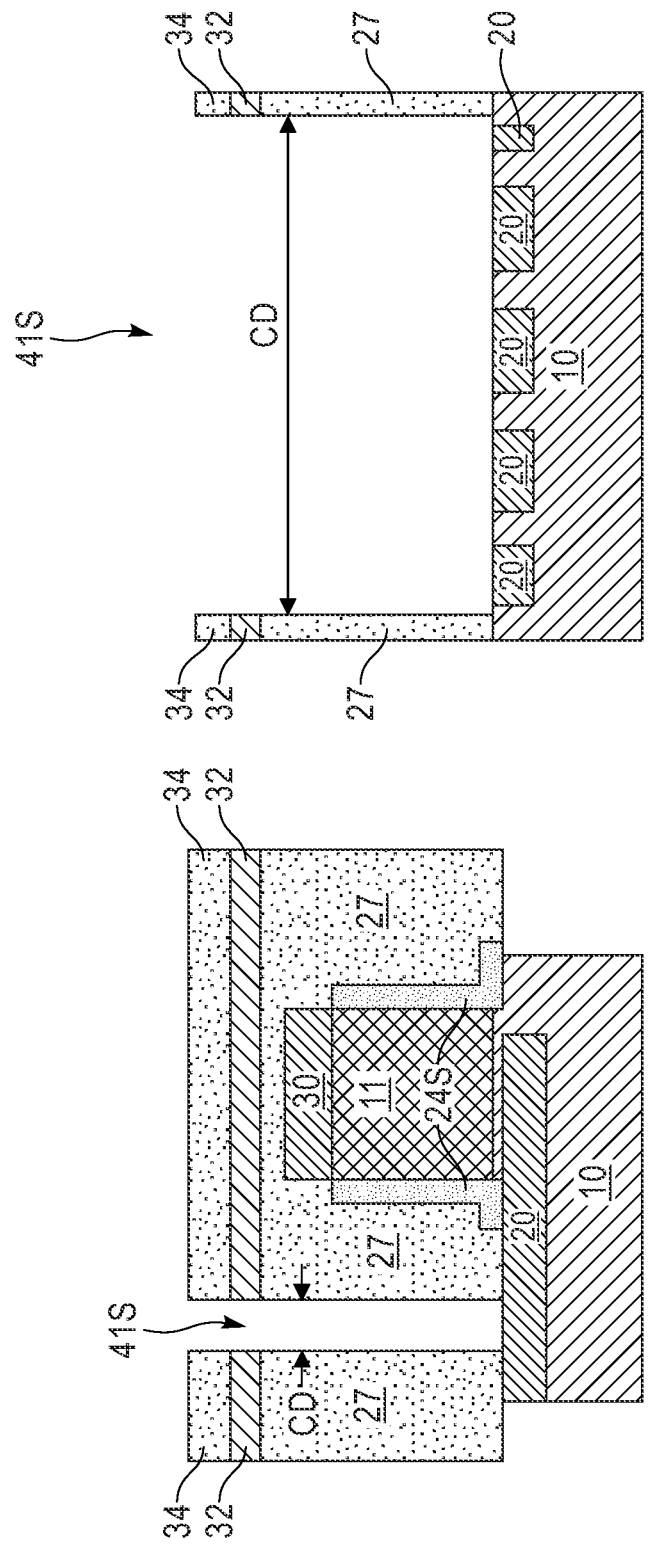
FIG. 16A is a cross sectional view of the exemplary structure shown in FIG. 10A and along X-X shown in FIG. 14 after forming a patterned contact rail mask on the MOL level dielectric stack, and then forming a single opening in the MOL level dielectric stack, the single opening exposing a topmost surface of each of the sacrificial semiconductor fins, removing each sacrificial semiconductor fin and completely removing the interlayer dielectric material in the single opening.
FIG. 16B is a cross sectional view of the exemplary structure shown in FIG. 16A but along Y1-Y1 shown in FIG. 14.

Referring now to FIGS. 16A, there is illustrated the exemplary structure shown in FIG. 10A and along X-X shown in FIG. 14 after forming a patterned contact rail mask (not shown) on the MOL level dielectric stack 32/34, and then forming a single opening in the MOL level dielectric stack 32/34, the single opening exposing a topmost surface of each of the sacrificial semiconductor fins 11C, removing each sacrificial semiconductor fin 11X and completely removing of the interlayer dielectric material 27. In this embodiment, a highly selective etch can be used to form the single contact rail opening 41S. Such processing provides a single contact rail opening 41S having a CD that is equal to the bar area that is along Y1-Y1 shown in FIG. 14. The Y1-Y1 cut for the exemplary structure shown in FIG. 16A is illustrated in FIG. 15B of the present application. It noted that in FIG. 16B 100% of the dielectric material 37 is removed during this step of the present application.

The exemplary structure shown in FIGS. 16A-16B can be processed to include the contact rail 42, a top source/drain contact structure 44, and gate contact structure 46 utilizing the processes sets mentioned above in forming the exemplary structure shown in FIGS. 13A-13B. In such an embodiment, the resultant contact rail has a constant critical dimension in a direction along the active semiconductor fin 11 (i.e., the semiconductor channel material structure).

Although the present application specifically discloses a method of forming a VTFET device, the concept of using a sacrificial semiconductor fin as a placeholder material for a contact rail can be adopted in processes used in forming other semiconductor devices, i.e., FinFETs, nanowire FETs, or nanosheet FETs.

While the present application has been particularly shown and described with respect to preferred embodiments thereof, it will be understood by those skilled in the art that the foregoing and other changes in forms and details may be made without departing from the spirit and scope of the present application. It is therefore intended that the present application is not limited to the exact forms and details described and illustrated, but fall within the scope of the appended claims.

What is claimed is:

1. A semiconductor device comprising:
   a functional gate structure including a first source/drain region located a first end of a semiconductor channel material structure and a second source/drain region located at a second end of the semiconductor channel material structure; and
   a contact rail located laterally adjacent to the functional gate structure and contacting a surface of the first source/drain region of the functional gate structure, wherein the contact rail has a lower portion having a first critical dimension and an upper portion having a second critical dimension that is greater than the first critical dimension, wherein the first critical dimension is 25 nm or less.

2. The semiconductor device of claim 1, wherein the semiconductor channel material structure is an active semiconductor fin and the functional gate structure is located laterally adjacent a sidewall of the active semiconductor fin.

3. The semiconductor device of claim 2, wherein the first source/drain region is a bottom source/drain structure, and the second source/drain region is a top source/drain region.

4. The semiconductor device of claim 1, further comprising a source/drain contact structure contacting the second source/drain region, and a gate contact structure contacting a gate conductor material of the functional gate structure.

5. The semiconductor device of claim 4, wherein the contact rail has a topmost surface that is coplanar with a topmost surface of each of the source/drain contact structure and the gate contact structure.

6. The semiconductor device of claim 1, wherein the contact rail is a discrete contact rail.

7. The semiconductor device of claim 1, wherein the contact rail is a via bar contact rail.

8. The semiconductor device of claim 1, wherein the contact rail is embedded in at least an interlayer dielectric material layer.

9. The semiconductor device of claim 8, wherein the contact rail is further embedded in a middle-of-the-line (MOL) level dielectric stack that is present atop the interlayer dielectric material layer.

10. A semiconductor device comprising:
    a functional gate structure including a first source/drain region located a first end of a semiconductor channel material structure and a second source/drain region located at a second end of the semiconductor channel material structure; and
    a contact rail located laterally adjacent to the functional gate structure and contacting a surface of the first source/drain region of the functional gate structure, wherein an entirety of the contact rail has a constant critical dimension in a direction along the semiconductor channel material structure.

11. The semiconductor device of claim 10, wherein the first source/drain region is a bottom source/drain structure, and the second source/drain region is a top source/drain region.

12. The semiconductor device of claim 11, further comprising a source/drain contact structure contacting the second source/drain region, and a gate contact structure contacting a gate conductor material of the functional gate structure.

13. The semiconductor device of claim 12, wherein the contact rail has a topmost surface that is coplanar with a topmost surface of each of the source/drain contact structure and the gate contact structure.

14. The semiconductor device of claim 12, wherein the contact rail is a via bar contact rail.

15. The semiconductor device of claim 11, wherein the contact rail is embedded in at least an interlayer dielectric material layer.

16. The semiconductor device of claim 15, wherein the contact rail is further embedded in a middle-of-the-line (MOL) level dielectric stack that is present atop the interlayer dielectric material layer.

17. A method of forming a semiconductor device, the method comprising:
    forming at least one sacrificial semiconductor fin in a first region of a semiconductor substrate and at least one active semiconductor fin in a second region of the semiconductor substrate, wherein the at least one sacrificial semiconductor fin has a first critical dimension;
    forming a source/drain region on the semiconductor substrate in the first region including the at least one sacrificial semiconductor fin and the second region including the at least one active semiconductor fin;
    forming a functional gate structure in the second region and laterally adjacent to the at least one active semiconductor fin;

forming a dielectric material stack adjacent to, and above, the at least one sacrificial semiconductor fin and the at least one active semiconductor fin;

forming an opening in the dielectric material stack that physically exposes the at least one sacrificial semiconductor fin, wherein the opening has a second critical dimension that is greater than the first critical dimension of the at least one sacrificial semiconductor fin;

removing the at least one sacrificial semiconductor fin to provide a contact rail opening having a lower portion having the first critical dimension and an upper portion having the second critical dimension, the contact rail opening physically exposes a surface of the source/drain region; and forming a contact rail in the contact rail opening and on the physically exposed surface of the source/drain region.

18. The method of claim 17, wherein the dielectric material stack includes at least a middle-of-the-line (MOL) level dielectric stack.

19. The method of claim 17, wherein the opening is a discrete opening.

20. The method of claim 17, opening is a via bar opening.

* * * * *